United States Patent [19]
Okamura

[11] Patent Number: 5,917,342
[45] Date of Patent: *Jun. 29, 1999

[54] BIMOS INTEGRATED CIRCUIT

[75] Inventor: Hitoshi Okamura, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/623,834

[22] Filed: Mar. 29, 1996

[30] Foreign Application Priority Data

Mar. 31, 1995 [JP] Japan ................................ 7-075263

[51] Int. Cl.$^6$ ........................... H03K 19/08; H01L 27/00
[52] U.S. Cl. ......................... 326/103; 326/110; 257/204; 257/378
[58] Field of Search .................. 326/109–110, 101–103; 257/204–206, 401, 378

[56] References Cited

U.S. PATENT DOCUMENTS

| | | |
|---|---|---|
| 4,425,516 | 1/1984 | Wanlass . |
| 4,554,467 | 11/1985 | Vaughn ................................. 327/203 |
| 5,053,909 | 10/1991 | Suzuki et al. ......................... 326/102 |
| 5,055,716 | 10/1991 | El Gamel . |
| 5,068,548 | 11/1991 | El Gamel ............................... 326/110 |
| 5,278,436 | 1/1994 | Asahina et al. ........................ 257/205 |
| 5,332,933 | 7/1994 | Raje ....................................... 326/103 |

FOREIGN PATENT DOCUMENTS

A-0 683 524  11/1995   European Pat. Off. .

OTHER PUBLICATIONS

Wissel, Larry, et al "A 180–ps, 220K–Circuit BICMOS ASIC Logic Chip", Proceedings of the IEEE 1992 Custom Integrated Circuits Conference, Boston, MA, May 3–6, 1992, pp. 27.4.1–27.4.4.

El Gamal, Abbas, et al "BiNMOS: A Basic Cell for BiCMOS Sea–of–Gates", Proceedings of the IEEE 1989 Custom Integrated Circuits Conference, San Diego, CA, May 15–18, 1989, pp. 8.3.1–8.3.4.

*Primary Examiner*—Jon Santamauro
*Attorney, Agent, or Firm*—Foley & Lardner

[57] ABSTRACT

A BiMOS integrated circuit includes a bipolar transistor for output pull-up; a BiMOS hybrid gate buffer section which comprises a MOS transistor for output pull-down which is longitudinally connected to the bipolar transistor, and a MOS transistor for base drive which comprises an output which is connected a base of the bipolar transistor to drive the base and a gate which is connected to an input; and a logical section which comprises at least a CMOS gate, the logical section having an output which is connected to the input; wherein the base drive MOS transistor has an input capacitance less than that of the output pull-down MOS transistor.

15 Claims, 8 Drawing Sheets

BiNMOS THREE-INPUT NOR

CMOS THREE-INPUT NOR

BIMOS INTEGRATED CIRCUIT

FIELD OF THE INVENTION

This invention relates to a BiMOS integrated circuit, and more particularly to a BiMOS integrated circuit in which a bipolar transistor and a MOS transistor are integrated on a common semiconductor substrate.

BACKGROUND OF THE INVENTION

FIG. 1 shows a conventional BiNMOS inverter. It comprises a first NPN transistor 29 in which the collector is connected to a high potential power source (hereinafter referred to as Vcc) 1 and the emitter is connected to an output terminal 8, NMOS 30 in which the source, drain and gate are connected to GND 2, output terminal 8 and input terminal 7, respectively, PMOS 31 in which the source, drain and gate are connected to Vcc 1, the base of the NPN transistor 29 and input terminal 7, respectively, and NMOS 32 in which the source, drain and gate are connected to GND 2, the base of the NPN transistor 29 and input terminal 7, respectively.

Herein, the gate width of NMOS 30 is set at that required to pull down a given load capacitance at a sufficient speed. For example, the gate width is 10 μm. The gate width of PMOS 31 is set to sufficiently shorten the time to charge the base of the NPN transistor 29. For example, the gate width is 12 μm. The gate width of NMOS 32 is set to sufficiently fast pull down the parasitic capacitance around the base of the NPN transistor 29. For example, the gate width is 5 μm.

In operation, when the potential of the input terminal 7 is changed high to low, PMOS 31 turns on and NMOS 32 simultaneously turns off thereby turning on the NPN transistor 29 to charge a load capacitance. Here, NMOS 30 turns off thereby not flowing a penetrating current between the NPN transistor 29 and NMOS 30.

When the potential of the input terminal 7 is changed low to high, PMOS 31 turns off and NMOS 32 simultaneously turns on thereby cutting off the base current for the NPN transistor 29 to reduce the base potential. Here, NMOS 30 turns on, thereby discharging the load capacitance to get down the output potential. If the gate width of NMOS 32 is set such that the falling speed of the base potential of the NPN transistor 29 is faster than that of the potential of the output terminal, the NPN transistor 29 continues to turn off to stop the penetrating current.

The power consumed in the above operation is mainly a power for the charge-and-discharge of the gate capacitance of MOS transistor and source and drain diffusion capacitance.

FIG. 2 shows a conventional CMOS inverter. PMOS 9 is used for pulling up the output potential and NMOS 10 is used for pulling down the output potential.

It is known that the gate width ratio of PMOS 9 and NMOS 10 is set about 2:1 to obtain the highest speed, since ON current per unit gate width of PMOS is about ½ that of NMOS. Furthermore, the rise and fall time of the output potential can be balanced. For example, the gate widths of PMOS 9 and NMOS 10 are set to 20 and 10 μm, respectively.

As the gate width of PMOS 9 is reduced, the rise time of the output becomes longer. However, since the logical threshold is simultaneously reduced, the operating speed in the case of connecting a gate with the same circuit constant is not highly degraded. Thus, in a gate array etc., to give priority to the integration density and consumed power, the gate width ratio of PMOS and NMOS 10 may be reduced to about 1.2:1. In this case, the gate widths of PMOS 9 and NMOS 10 are, for example, set 12 and 10 μm, respectively.

However, it is not preferable that the ratio is less than 1.1. Because, in the case that a constant total gate width is set, if a larger gate width is assigned to NMOS therefrom, the consumed power is not reduced and the operating speed is decreased.

The operation speeds of the above-mentioned CMOS gate circuit and BiNMOS gate circuit are generally equal under a low load condition. Therefore, when a circuit block with a complex logic is composed, the main section is generally composed of the CMOS gate circuit which facilitates to compose the circuit and has a high integration density and BiNMOS is used only for the output section and a section with a large fan-out.

The above logical circuits can be composed as a master-slice type semiconductor integrated circuit in which arrays of transistors, resistance elements, etc., are previously placed on a semiconductor substrate and the elements on the substrate are interconnected on the wiring process.

FIG. 3 shows a basic cell layout for a conventional BiNMOS gate array. Two PMOSs 34 and 35 are formed on a common diffusion region 33 and have commonly a diffusion region contact.

Similarly, two NMOSs 37 and 38 are formed on a common diffusion region 36 and have commonly a diffusion region contact. Also, two small NMOSs 40 and 41 are formed on a diffusion region 39 separated from NMOSs 37 and 38, and a NPN transistor 42 is provided.

The gate widths of PMOSs 34, 35, NMOSs 37, 38 and small NMOSs 40, 41 are set to 12 μm, 10 μm and 5 μm, respectively.

For example, in the BiNMOS inverter in FIG. 1, NPN 42 is used as the NPN transistor 29, PMOS 34 or 35 is used as PMOS 31, NMOS 37 or 38 is used as NMOS 30 for output pull-down, and NMOS 40 or 41 is used as NMOS 32.

In a further complex logical block, a BiNMOS gate is used in an output drive section and a CMOS gate is used in a logical composition section. Thus, NMOS 30 for output pull-down of the BiNMOS gate and NMOS used in the logical composition section have the same gate width since they use NMOSs 37 and 38 in FIG. 3.

Also, PMOS 31 for driving the base of the NPN transistor 29 of the BiNMOS gate and PMOS used in the logical composition section have the same gate width since they use PMOSs 34 and 35.

FIG. 4 shows a basic cell layout for a conventional CMOS gate array. Two PMOSs 44 and 45 are formed on a common diffusion region 43 and have commonly a diffusion region contact. Similarly, two NMOSs 47 and 48 are formed on a common diffusion region 46 and have commonly a diffusion region contact. The gate widths of PMOSs 44, 45 and NMOSs 47, 48 are set to 12 μm and 10 μm, respectively.

FIG. 5 shows another example of a basic cell layout for a conventional BiNMOS gate array which is disclosed in U.S. Pat. No. 5,055,716.

In the above example, transistors used only for each of a CMOS logical section 49 and a BiNMOS buffer section 50 are provided in the basic cell. Though the CMOS logical section 49 can use MOS transistors with gate widths smaller than that of MOS transistors used in the BiNMOS buffer section 50, the place where the BiNMOS buffer is composed must be limited since a NPN transistor does not exist in the CMOS logical section.

Thus, when small logical blocks such as a BiNMOS inverter are continuously disposed, or when a gate which has few numbers of output regardless of many MOS transistors, for example, a 16:1 selector, is placed, useless transistors will be left since the BiNMOS buffer section is not used so frequently.

As described above, in the conventional BiNMOS logical integrated circuit, even when the gate width of NMOS for output pull-down in a BiNMOS gate and the gate width of NMOS in a CMOS gate are equal, or the gate width of NMOS in the CMOS gate is shortened by changing the size, the former leads to an increase in consumed power and a decrease in integration density and the latter leads to a lack of integration density. As a result, it can not realize a high integration density and low consumed power as compared with the same generation CMOS logical integrated circuit.

SUMMARY OF THE INVENTION

Accordingly, it is an object of the invention to provide a BiMOS integrated circuit which is provided with a higher integration density and lower consumed power than the same generation CMOS integrated circuit.

According to the invention, a BiMOS integrated circuit, comprises:

a bipolar transistor for output pull-up;

a BiMOS hybrid gate buffer section which comprises a MOS transistor for output pull-down which is longitudinally connected to the bipolar transistor, and a MOS transistor for base drive which comprises an output which is connected a base of the bipolar transistor to drive the base and a gate which is connected to an input; and a logical section which comprises at least a CMOS gate, the logical section having an output which is connected to the input;

wherein the base drive MOS transistor has an input capacitance less than that of the output pull-down MOS transistor.

Herein, when the wiring length is short in a relatively small circuit, the wiring capacitance is sufficiently lower than the capacitance of the gate, source and drain of MOS. Therefore, even if the gate width of the CMOS gate is decreased and the input capacitance thereof is less than that of the BiNMOS hybrid gate, the operating speed is not degraded and the consumed power can be reduced. The logical section may comprise a CMOS gate and BiNMOS gate.

The BiMOS integrated circuit of the invention may be fabricated by a master-slice manner in which a basic cell array which comprises combining a plurality of transistors is disposed on a semiconductor substrate and the transistors are interconnected to implement a given logical function, or by a master-slice manner in which a basic cell array which comprises combining a plurality of transistors is disposed on a semiconductor substrate and the transistors are interconnected to implement a given logical function.

To satisfy that the base drive MOS transistor has an input capacitance less than that of the output pull-down MOS transistor" by the master-slice manner or the standard-cell manner, the output pull-down MOS transistor of the BiMOS hybrid gate may comprise connecting in parallel MOS transistors which have the same conductivity type of the logical section, or may comprise connecting in parallel a MOS transistor which is buried in an interconnection region and a MOS transistor which has the same conductivity type of the logical section.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
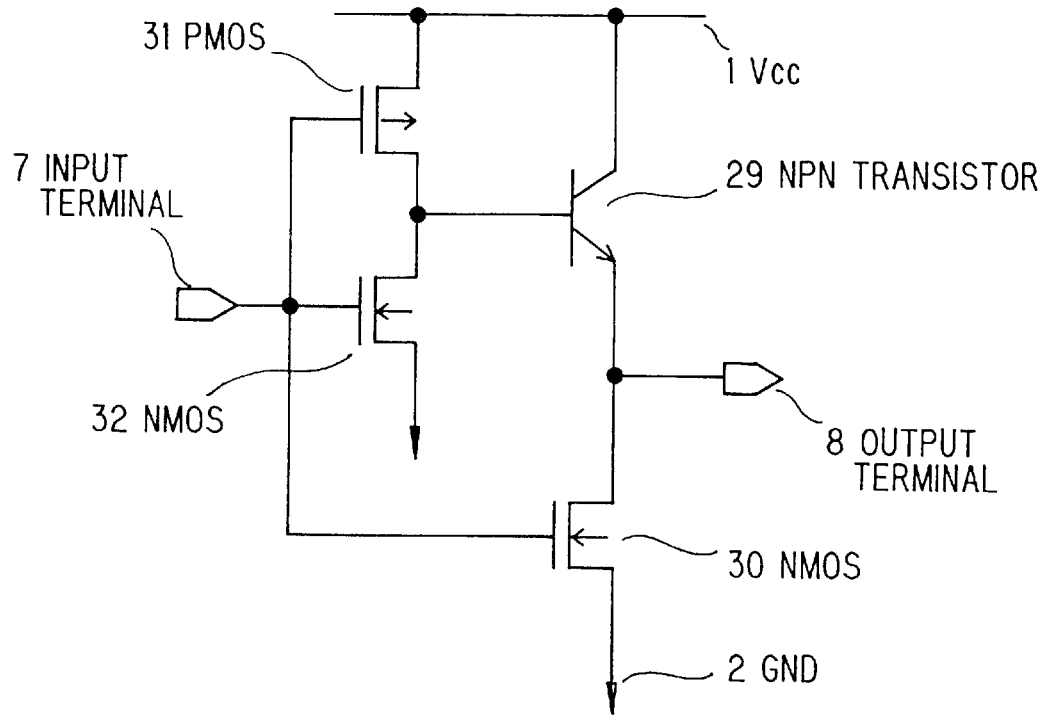
FIG. 1 is a circuit diagram showing a conventional BiNMOS inverter.

A BiNMOS inverter used for a semiconductor integrated circuit in the first preferred embodiment will be explained in FIG. 6, wherein like parts are indicated by like reference numerals as used in FIG. 1.

A NPN transistor 3 as an output pull-up device and a NMOS transistor 4 as an output pull-down device are connected in series with each other. Namely, the collector terminal of the NPN transistor 3 is connected to Vcc 1 and the emitter thereof is connected to an output terminal 8. The source of NMOS 4 is connected to GND 2 and the drain thereof is connected to the output terminal 8 and the gate thereof is connected to an input terminal 7.

In this embodiment, CMOS is used to drive the base of the NPN 3. Namely, the source of PMOS 5 is connected to Vcc 1 and the drain thereof is connected to the base of the NPN transistor 3 and the gate thereof is connected to the input terminal 7. The source of NMOS 6 is connected to GND 2 and the drain thereof is connected to the base of NPN transistor 3 and the gate thereof is connected to the input terminal 7.

The respective transistors have commonly a gate length of 0.5 $\mu$m and a gate silicon oxide film thickness of 0.1 $\mu$m. The gate widths are set at, for example, 6 $\mu$m in PMOS 5, 1.5 $\mu$m in NMOS 6 and 10 $\mu$m in NMOS 4. Namely, the total (7.5 $\mu$m) of the gate widths of PMOS 5 and NMOS 6 for driving the base of the NPN transistor 3 as an output pull-up device is less than the gate width(10 $\mu$m) of NMOS 4 as an output pull-down device. Since the thickness of gate insulating films and channel lengths are common in the respective transistors, the gate input capacitance of NMOS 4 is greater than the total gate input capacitance of PMOS 5 and NMOS 6.

Figure 2:
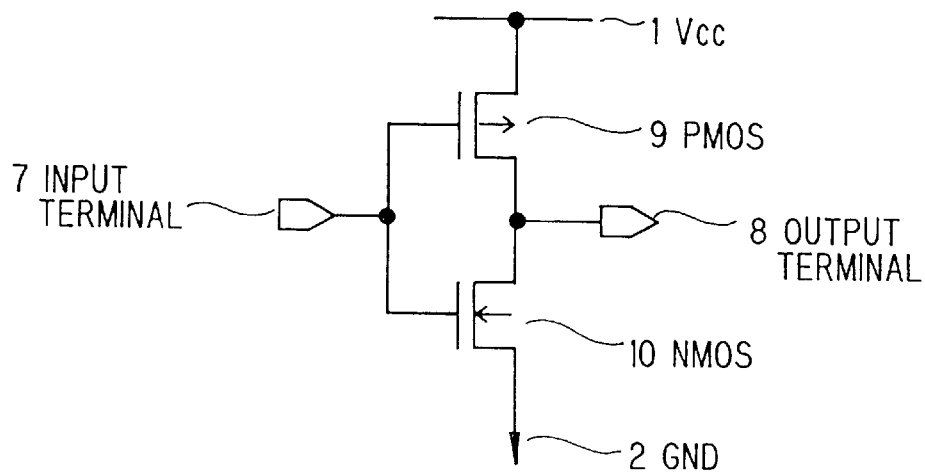
FIG. 2 is a circuit diagram showing a conventional CMOS inverter.
Figure 3:
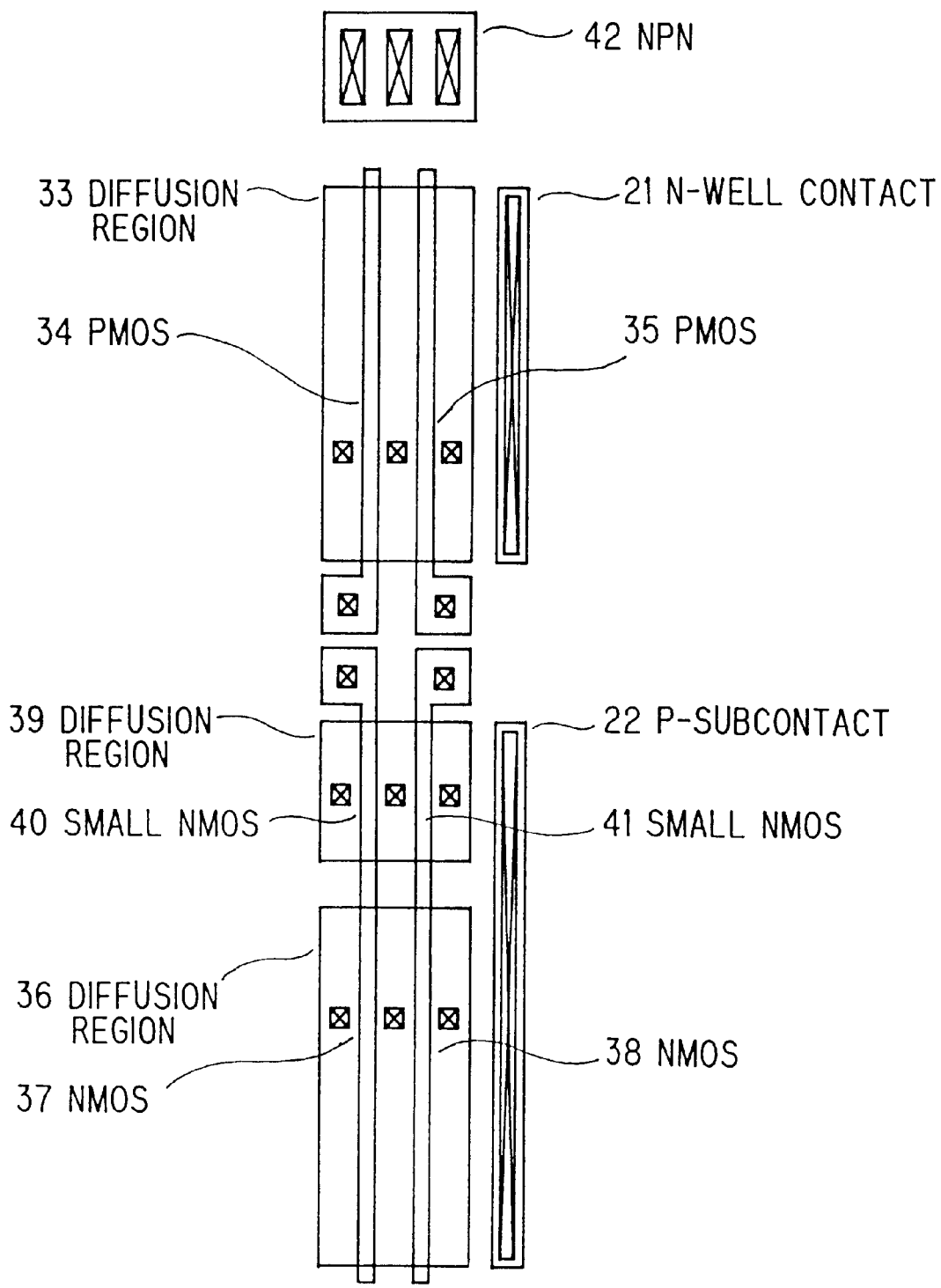
FIG. 3 shows an example of a basic cell layout for a conventional BiNMOS gate array.
Figure 6:
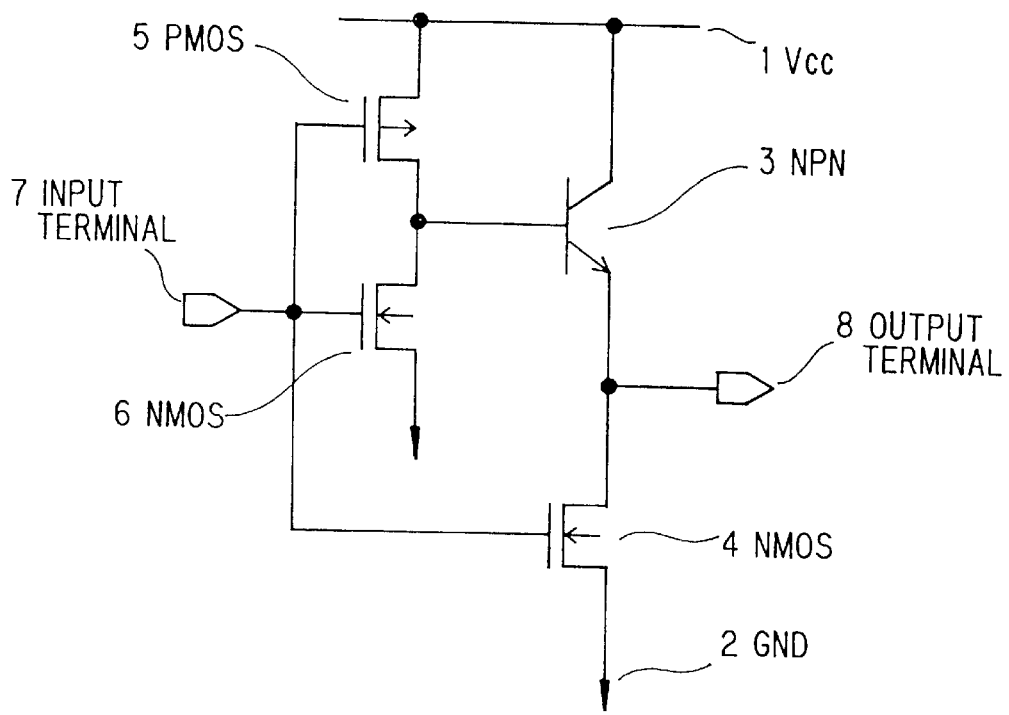
FIG. 6 is a circuit diagram showing a BiNMOS inverter used for a semiconductor integrated circuit according to the invention.

In a NAND gate, NOR gate etc., both the BiNMOS gate in FIG. 6 and the CMOS gate in FIG.2 have MOS transistors increased in proportion to the number of input.

Figure 7A:
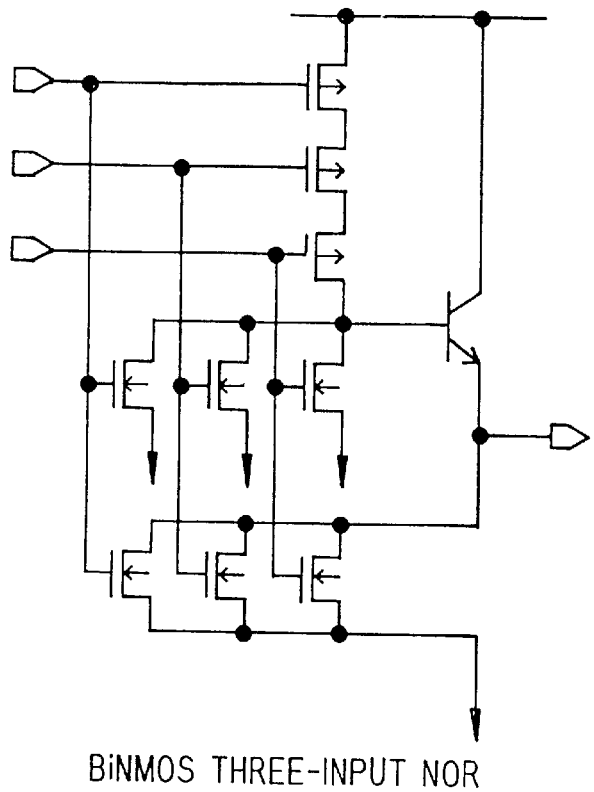
FIGS. 7A and 7B are circuit diagrams showing a three-input NOR BiNMOS gate and CMOS gate, respectively.
Figure 7B:
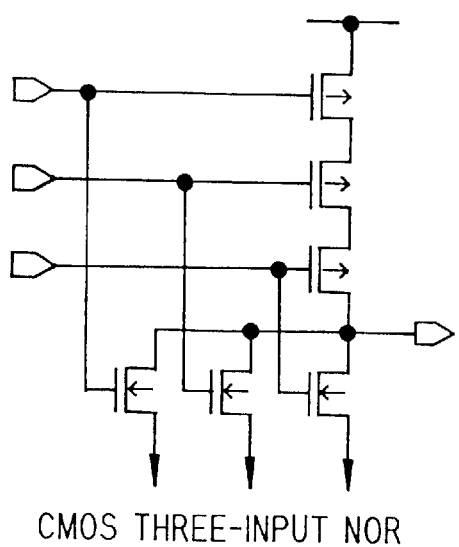

FIGS. 7A and 7B are circuit diagrams showing examples of three-input NOR gates comprising BiNMOS gates and CMOS gates, respectively. For example, the number ratio of MOS transistors in the BiNMOS gate as shown in FIG. 6 and transistors in the CMOS gate as shown in FIG. 2 is 3:2 in an inverter, 6:4 in a two-input NAND(NOR) and 9:6 in a three-input NAND(NOR). Thus, the number ratio of transistors, i.e., the ratio of total gate width, is constant regardless of the logic between the BiNMOS gate and the CMOS gate. Therefore, the consumed power in the BiNMOS gate is always less than that in the CMOS gate.

Figure 8:
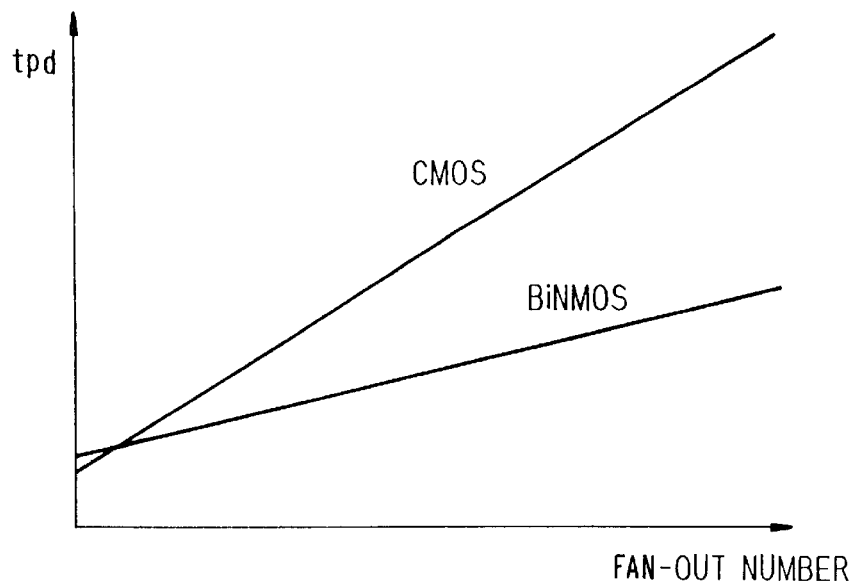
FIG. 8 shows a fan-out dependency on a delay time of a BiNMOS inverter according to the invention.

FIG. 8 shows the fan-out dependency of the delay time of BiNMOS inverter in a BiMOS integrated circuit of the invention. The BiNMOS inverter can obtain a load driving current equal to that in a CMOS inverter which comprises PMOS with 20 $\mu$m gate width and NMOS with 10 $\mu$m. The input capacitance of the BiNMOS gate as a fan-out load is six-tenths that of CMOS gate when the gate capacitances per a unit gate width of PMOS and NMOS are identical. Therefore, the fan-out dependency of the operating speed in the BiNMOS gate is (16.5/20)/(20/15)=62% of the CMOS gate which has 10 $\mu$m gate widths for both PMOS and NMOS. Here, 16.5/20 is the ratio of the input capacitances between the BiNMOS and the CMOS.

Furthermore, since the input capacitance of a BiMOS hybrid gate is 11/20 that of CMOS which has 10 $\mu$m gate widths for both PMOS and NMOS, the fan-out dependency of the operating speed in the BiNMOS gate when driving the BiMOS hybrid gate is only (11/20)/(20/15)=41% of the CMOS. Here, 11/20 is the ratio of the input capacitances between the BiMOS hybrid gate and the CMOS and 20/15 is the ratio of the driving currents between the BiMOS hybrid gate and the CMOS.

The reasons are considered as follows. The mutual conductance of PMOS is generally smaller than that of NMOS. Thus, if the speed is desired, the gate width of PMOS of CMOS needs to be larger than that of NMOS thereof. In the BiNMOS gate, since the NPN bipolar transistor is used for an output pull-up, the driving current thereof is greater than that of PMOS. Furthermore, since the bipolar has also current amplification characteristics, the gate width of the MOS transistor for supplying a base current thereto may be reduced.

Accordingly, when the gate input capacitance of the MOS transistor for driving the NPN transistor for an output pull-up is less than that of NMOS for an output pull-down, the gate width of the transistor in a CMOS logic section for driving a BiNMOS buffer section can be reduced without degrading the speed of the BiNMOS buffer section as compared with the same generation CMOS. As a result, the consumed power can be reduced.

Figure 9:
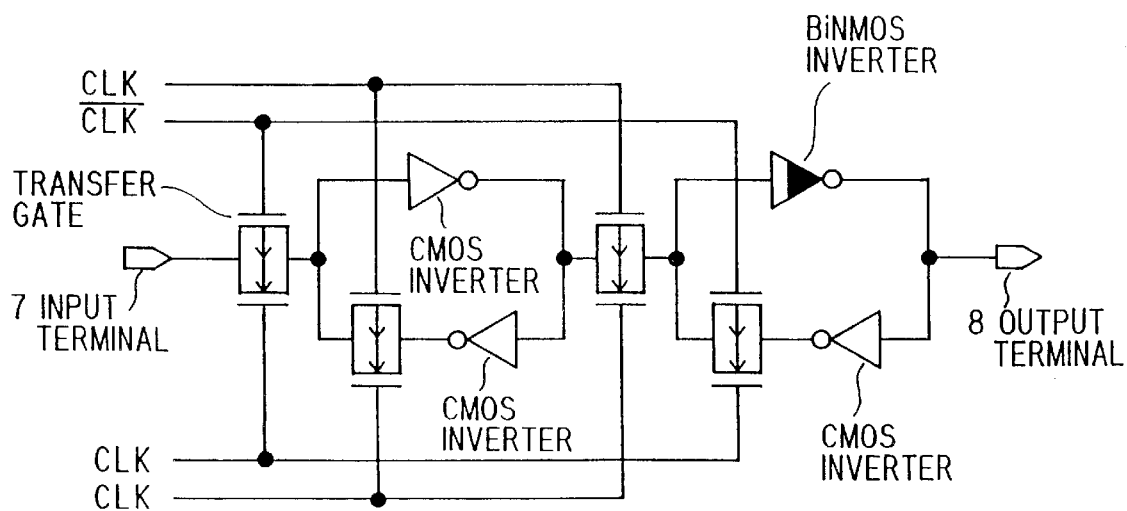
FIG. 9 is a circuit diagram showing a flip-flop used for a semiconductor integrated circuit according to the invention.
Figure 10:
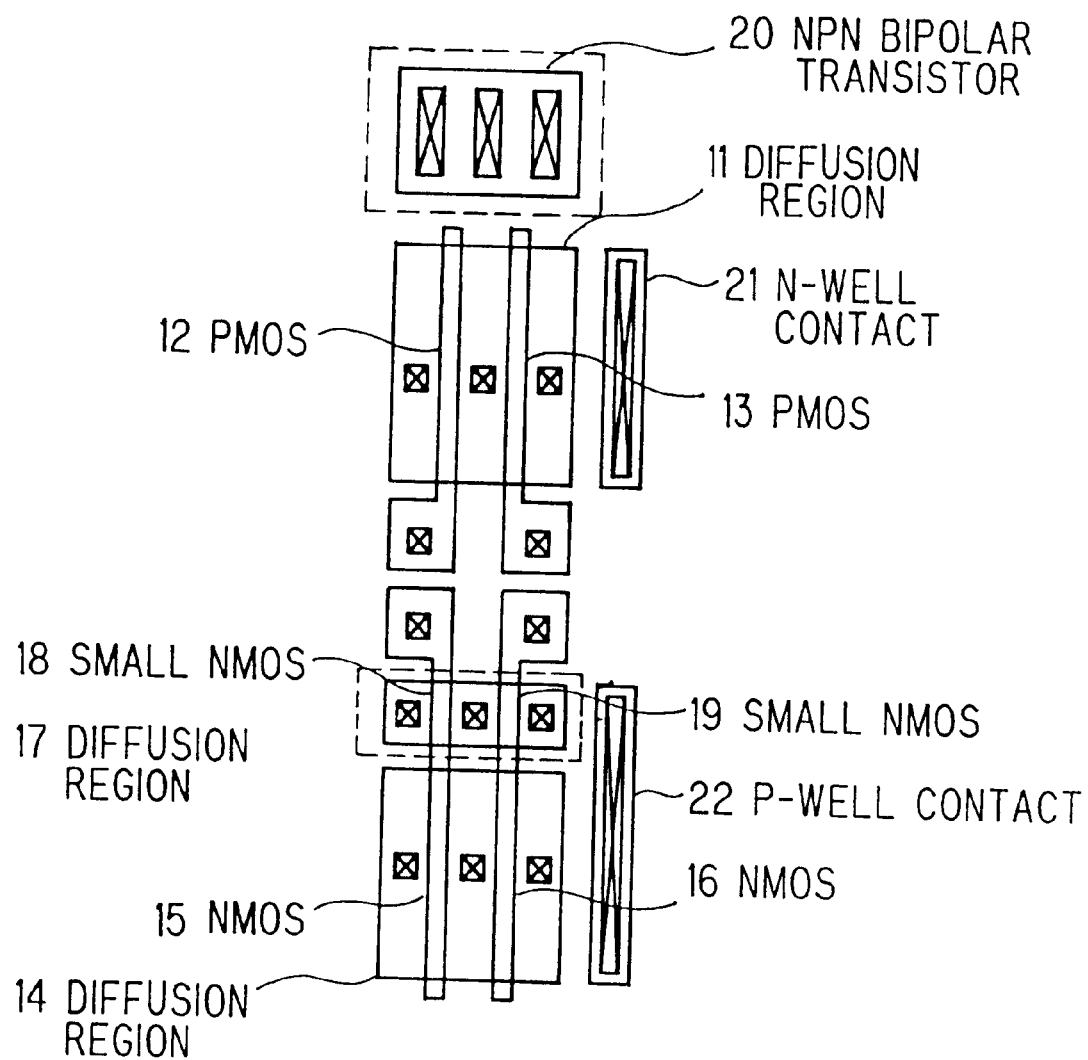
FIG. 10 shows a basic cell layout for a gate array in a first preferred embodiment according to the invention.

FIG. 9 is a circuit diagram showing an example of the flip-flop conducting a complex logic macro composed by combining an output drive circuit comprising a BiNMOS gate and a logic circuit comprising a CMOS gate. A latch circuit and a transfer gate, etc., are composed of MOS transistors. A data output section employs a BiNMOS gate (inverter). Herein, the gate width of the CMOS transistor used in the logic section is set to 6 $\mu$m and 5 $\mu$m in PMOS and NMOS, respectively FIG. 10 shows an example of a basic cell layout for a gate array in a semiconductor integrated circuit according to the invention. It comprises two PMOSs 12 and 13 placed in the same N-type diffusion region, two NMOSs 15 and 16 placed in the same P-type diffusion region 14, small NMOSs 18 and 19 formed in the same diffusion region 17 for providing the small NMOS 6 shown in FIG. 6 and a NPN transistor 20.

The collector burying region of the NPN transistor 20 and N wells of PMOSs 12 and 13 are formed in a common region and are connected to Vcc. The gate widths of PMOSs 12, 13 and NMOSs 15, 16 are set 6 $\mu$ m and 5 $\mu$ m, respectively. N-well contact 21 and F-well contact are also included and are connected to Vcc and GND, respectively.

In a gate array, an internal region except a burying macro and interface circuit array is formed disposing a basic cell as shown in FIG. 10.

The gate width of NMOS in the BiNMOS gate is 10 $\mu$m. This is formed connecting in parallel two NMOSs with 5 $\mu$m gate width as explained in FIG. 10. The gate input capacitance of the 10 $\mu$m NMOS is greater than the total input capacitance of PMOS and NMOS composing CMOS of the input of BiNMOS gate. The input capacitance of CMOS composing the logic section is set to be less than that of the BiNMOS gate.

Here, when the wiring capacitance is negligible as compared with the gate capacitance and diffusion capacitance of source and drain in the MOS transistor, the delay time of the CMOS gate does not depend on the gate width used. This is because the gate capacitance and the source and drain diffusion capacitance as well as the ON current are proportional to the gate width.

When the wiring length is short as in a relatively small logic macro, for example, 20 $\mu$m, the wiring capacitance is about 2 to 4 fF. This value is sufficiently small as compared with the sum (55 fF) of the gate capacitance and the source and drain diffusion capacitance of PMOS with 5 $\mu$m gate width and NMOS with 5 $\mu$m gate width.

Accordingly, in the limited range of a small-scale logic macro, even if the logic section composed of only MOS transistors is designed with such small gate width, the operating speed is not degraded.

On the other hand, the consumed power is proportional to the gate width. For example, as compared with the CMOS logic section composed of PMOS with 12 $\mu$m gate width and NMOS with 10 $\mu$m gate width, the CMOS logic section composed of PMOS with 6 $\mu$m gate width and a MOS transistor with 5 $\mu$m gate width has a consumed power 50% reduced.

The CMOS logic section in a BiMOS integrated circuit according to the invention is composed of PMOSs 12, 13 and NMOSs 15, 16. The BiMOS buffer section, for example, which is an inverter, is composed of PMOS 12 or 13 and NMOS 18 or 19 as a MOS transistor for driving the base of the NPN transistor 20. The 10 $\mu$m NMOS for an output pull-down is composed in parallel connecting two NMOSs 15 and 16.

The inventor of the present invention has found that the ratio of one cell per 6 to 8 cells is required for a BiNMOS output section when the gate array uses the above-mentioned basic cell by taking statistics to kind design results of a gate array. In the case of the embodiment in FIG.10, where NMOS 4 with 10 $\mu$m gate width for an output pull-down in the BiNMOS gate as shown in FIG. 6 is composed connecting in parallel NMOSs 15 and 16 with 5 $\mu$m gate width, even if one region of PMOSs 12 and 13 is useless, the ratio thereof to the whole is very small. Namely, since only one PMOS per 6 to 8 cells is useless, the ratio of the useless region to the whole area is very small.

Furthermore, the useless region is much smaller even compared with a conventional PNMOS gate array which is disclosed in U.S. Pat. No. 5,055,716 because there is no restriction of the macro placement.

Thus, in this embodiment, since the BiMOS buffer and CMOS logic sections commonly use MOS transistors except NMOSs 18 and 19 with short gate width, the number of useless transistors is significantly small wherever the logic macro is disposed.

Figure 4:
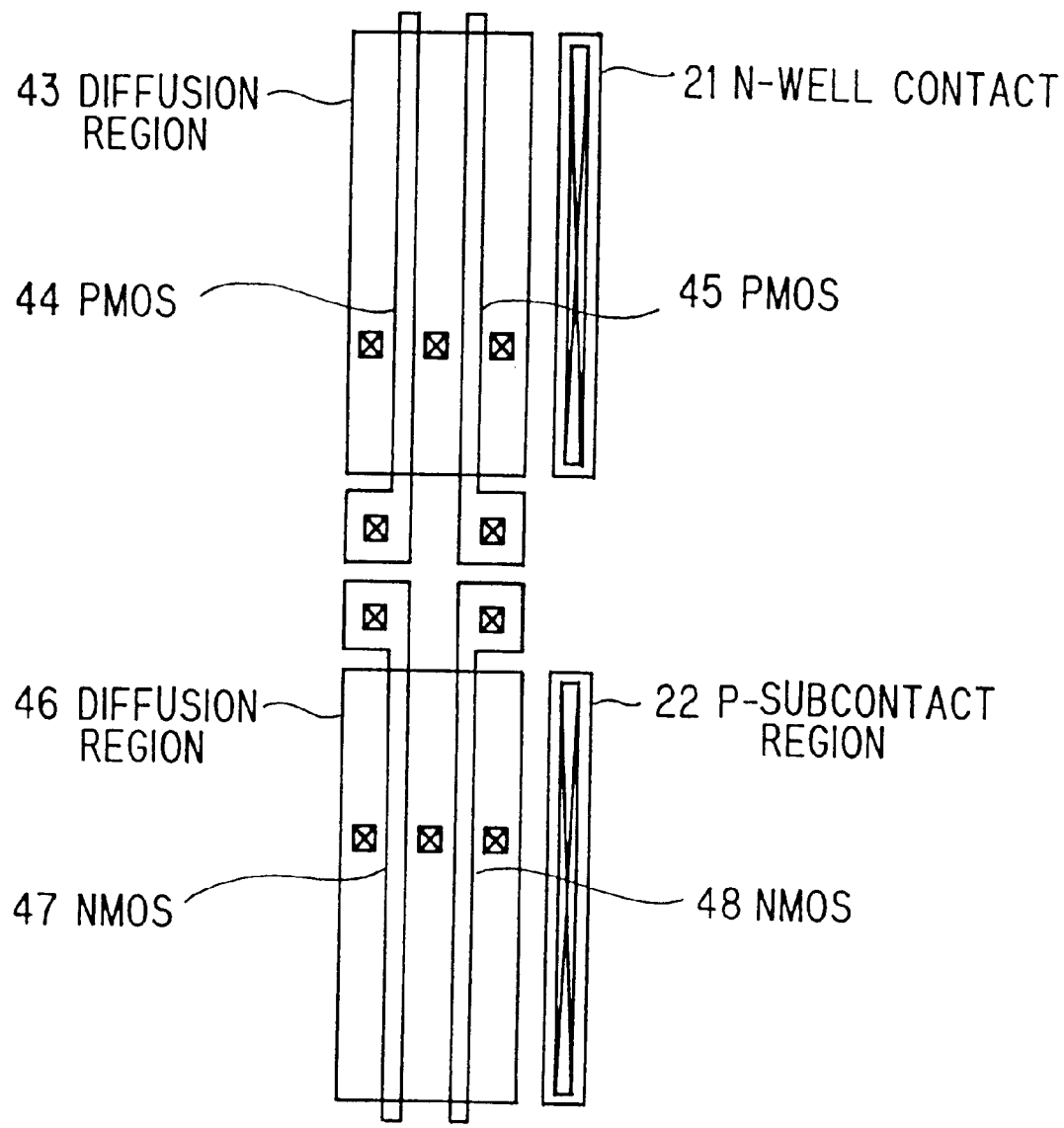
FIG. 4 shows an example of a basic cell layout for a conventional CMOS gate array.
Figure 5:
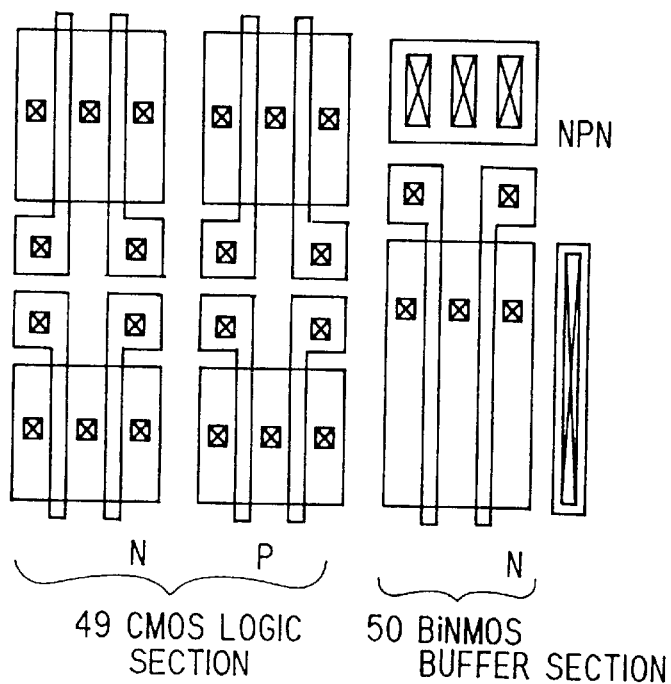
FIG. 5 shows another example of a basic cell layout for a conventional BiNMOS gate array.

Furthermore, when a NPN transistor and NMOS are buried in a region vacated by decreasing the gate widths of PMOSs 12 and 13, for example, a NPN transistor with 0.8 $\mu$m×1.8 $\mu$m emitter size and NMOS with 1.5 $\mu$m gate width, are used, the integration density can be improved as compared with the conventional CMOS gate array as shown in FIG. 4. Since bipolar transistors used for the recent submicron BiCMOS process have a reduced base parasitic capacitance, the delay time does not highly vary even when the gate widths of PMOSs 12, 13 and NMOSs 18, 19 for driving the base are decreased.

Herein, "macro" means a block prepared to conduct a logic with a function which is used in a hierarchical design technique for efficiently designing LSI. Particularly in the case of designing a logical LSI, some macros are generally combined to design it. For example, for a microprocessor, an ALU macro, register macro and cache memory are combined. For a gate array, a NAND gate and flip-flop gate are combined as a macro. It is used for both a circuit level and layout level. The abovementioned burying macro means a macro buried into a gate array.

Figure 11:
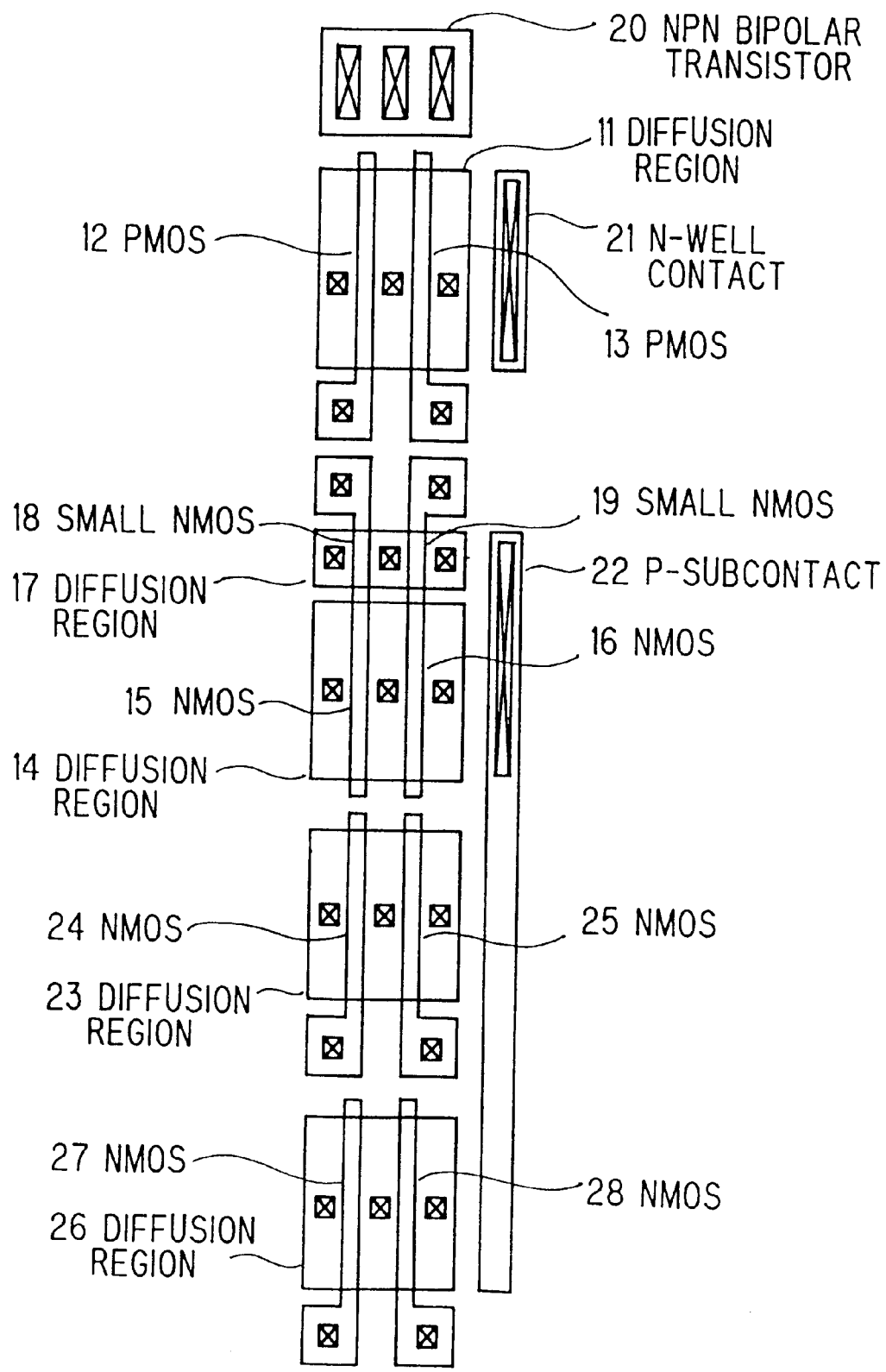
FIG. 11 shows a basic cell layout for a gate array in a second preferred embodiment according to the invention.

FIG. 11 is a layout showing a gate array in the second preferred embodiment according to the invention. In the second embodiment, NMOSs 24, 25, 27 and 28 composing SRAM are disposed in the basic cell other than the transistors shown in FIG. 10. NMOSs 24 and 25 are formed in a common diffusion region 23, and NMOSs 27 and 28 are formed in a common diffusion region 26. These are MOS transistors buried in a wiring region. The gate widths of MNOSs 24, 25, 27 and 28 are set, for example, to 5 $\mu$m. NMOS 4 for an output pull-down which composes the BiNMOS as shown in FIG. 6 is formed connecting in parallel NMOS 15 or 16 for a logic circuit and one of NMOS 24, 25, 27 or 28 for SRAM.

In this embodiment, there is an advantage that a BiNMOS gate array with built-in SRAM which has an improved integration density as compared with CMOS with a built-in MOS transistor for composing SRAM can be provided.

Alternatively, in the above embodiments, where the logic section is composed of CMOS, the logic section may comprise CMOS and BiNMOS.

In the above embodiments, a so-called master-slice manner gate array is illustrated in which a basic cell composed combining a plurality of array transistors which are previously disposed on a semiconductor substrate is used and necessary transistors are connected on the wiring process to perform a desired logical function. However, the spirit of the invention can be also realized in a so-called standard-cell manner BiCMOS integrated circuit in which logical function blocks optimized in desired logical functions as well as a diffusion process are combined and interconnected. In the standard cell manner, since bipolar transistors can be disposed only when necessary not to bring useless bipolar transistors, the integration density can further be improved compared to the master-slice manner gate array.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A BiMOS integrated circuit disposed on a semiconductor substrate, comprising:

an input terminal;
   an output terminal;
   a bipolar-MOS hybrid gate section which includes,
   an output pullup section which includes a bipolar transistor, said bipolar transistor having a base, a collector and a source, said source being connected to said output terminal, said bipolar transistor being buried in a first region on said semiconductor substrate; and
   an output pulldown section which includes a first MOS transistor, said first MOS transistor connected in series with said first bipolar transistor, said first MOS transistor having a gate, source and a drain, said drain being connected to said output terminal, said first MOS transistor being formed by connecting in parallel two MOS transistors having equal gate widths that are buried in a first diffusion region on said semiconductor substrate; and
   a CMOS gate section which includes a second MOS transistor having a gate, a source and a drain, and a third MOS transistor having a gate, a source and a drain, said third MOS transistor being connected in series with said second MOS transistor, said gates of said second and third MOS transistors being connected to said input terminal and said drains of said second and third MOS transistors being connected to said base of said bipolar transistor, said CMOS gate section connected between said input terminal and said base of said bipolar transistor, said second MOS transistor being buried in a second diffusion region on said semiconductor substrate with a fourth MOS transistor having an equal gate width, said third MOS transistor being buried in a third diffusion region on said semiconductor substrate with a fifth MOS transistor having an equal gate width less than that of each of said second and fourth MOS transistors,
   wherein said second MOS transistor has an input capacitance less than that of said first MOS transistor,
   wherein said BiMOS integrated circuit is fabricated by a master-slice manner in which a basic cell array comprised of a plurality of transistors is disposed on a semiconductor substrate and said plurality of transistors are interconnected to implement a given logical function, and
   wherein said gate of said third MOS transistor is connected to said gate of said first MOS transistor, said third MOS transistor also functioning as part of said output pulldown section.

2. A BiMOS integrated circuit according to claim 1, wherein said second and third MOS transistors provide a base drive for said bipolar transistor.

3. A BiMOS integrated circuit according to claim 1, wherein said gate of said first MOS transistor is connected to said input terminal and said source of said first MOS transistor is connected to ground, and
   wherein said gate of said third MOS transistor is connected to said input terminal and said source of said third MOS transistor is connected to said ground.

4. A BiMOS integrated circuit according to claim 3, wherein said second MOS transistor is of a first conductivity type, said third MOS transistor is of a second conductivity type, and said first MOS transistor is of the second conductivity type.

5. A BiMOS integrated circuit according to claim 1, wherein said first, second and third MOS transistors have a same gate length and a same gate silicon oxide film thickness, and wherein a sum of gate widths of said second and third MOS transistors is less than a gate width of said first MOS transistor.

6. A BiMOS integrated circuit according to claim 2, wherein said first, second and third MOS transistors have a same gate length and a same gate silicon oxide film thickness, and wherein a sum of gate widths of said second and third MOS transistors is less than a gate width of said first MOS transistor.

7. A BiMOS integrated circuit according to claim 3, wherein said first, second and third MOS transistors have a same gate length and a same gate silicon oxide film thickness, and wherein a sum of gate widths of said second and third MOS transistors is less than a gate width of said first MOS transistor.

8. A BiMOS integrated circuit according to claim 1, wherein a total occupied area of said bipolar-MOS hybrid gate section on said semiconductor substrate is less than an occupied area of said CMOS gate section on said semiconductor substrate.

9. A BiMOS integrated circuit according to claim 1, wherein second MOS transistor is PMOS and said third MOS transistor is NMOS, thereby forming said CMOS gate section.

10. A BiMOS integrated circuit according to claim 1, wherein said first MOS transistor is connected in parallel with said third MOS transistor to realize a pulldown function for said BiMOS integrated circuit.

11. A BiMOS integrated circuit according to claim 1, wherein said third MOS transistor is buried in an interconnection region on said semiconductor substrate, said interconnection region corresponding to said third diffusion region and being located between cell array rows disposed on said semiconductor substrate.

12. A BiMOS integrated circuit according to claim 5, wherein the gate width of said second MOS transistor is greater than the gate width of said third MOS transistor.

13. A BiMOS integrated circuit according to claim 1, wherein said CMOS gate section includes said two MOS transistors buried in the first diffusion region, said second MOS transistor and said third MOS transistor, wherein said bipolar-MOS hybrid gate section includes said two MOS transistors buried in the first diffusion region, and wherein said two MOS transistors buried in the first diffusion region operate in both the CMOS gate section and said bipolar-MOS hybrid gate section.

14. A BiMOS flip-flop comprising:

an input terminal;

an output terminal;

a first CMOS inverter having an input connected to said input terminal and an output; and a second CMOS inverter having an input connected to said output of said first CMOS inverter, said second CMOS inverter having an output connected to said input of said first CMOS inverter;

a third CMOS inverter having an input connected to said output terminal and an output; and a Bi-MOS inverter connected in parallel with said third CMOS inverter, said Bi-MOS inverter including, a bipolar-MOS hybrid gate section which includes, an output pullup section which includes a bipolar transistor, said bipolar transistor having a base, a collector and a source, said source being connected to said output terminal; and an output pulldown section which includes a first MOS transistor, said first MOS transistor connected in series with said bipolar transistor, said first MOS transistor having a gate, source and a drain, said drain being connected to said output terminal, said first MOS transistor being formed by connecting in parallel two MOS transistors buried in a same diffusion region and having a same gate width; and a CMOS gate section which includes a second MOS transistor having a gate, a source and a drain, and a third MOS transistor having a gate, a source and a drain, said third MOS transistor being connected in series with said second MOS transistor, said gates of said second and third MOS transistors being connected to said input terminal and said drains of said second and third MOS transistors being connected to said base of said bipolar transistor, wherein said second MOS transistor has an input capacitance less than that of said first MOS transistor, wherein said BiMOS flip-flop is fabricated by a master-slice manner in which a basic cell array comprised of a plurality of transistors is disposed on a semiconductor substrate and said plurality of transistors are interconnected to implement a given logical function, and wherein said gate of said third MOS transistor is connected to said gate of said first MOS transistor, said third MOS transistor also functioning as part of said output pulldown section.

15. A gate array disposed on a semiconductor substrate, comprising:

an NPN bipolar transistor buried in a first region on said semiconductor substrate;

first and second NMOS transistors buried in a first diffusion region on said semiconductor substrate and having a same gate width;

third and fourth NMOS transistors buried in a second diffusion region on said semiconductor substrate and having the same gate width as said first and second NMOS transistors, the first through fourth NMOS transistors corresponding to an SRAM structure on said semiconductor substrate; and fifth and sixth NMOS transistors buried in a third diffusivity region on said semiconductor substrate and having a same gate width different from the gate width of said first through fourth NMOS transistors, wherein a BiNMOS gate array is formed by providing a bipolar-MOS hybrid gate section with said NPN bipolar transistor and one of said fifth and sixth NMOS transistors, and an SRAM section with one of said first through fourth NMOS transistors.

* * * * *